United States Patent
Liu et al.

(10) Patent No.: US 9,918,389 B2
(45) Date of Patent: Mar. 13, 2018

(54) ELECTROLESS METALLIZATION OF DIELECTRICS WITH ALKALINE STABLE PYRAZINE DERIVATIVE CONTAINING CATALYSTS

(71) Applicant: Rohm and Haas Electronic Materials LLC, Marlborough, MA (US)

(72) Inventors: Feng Liu, Marlborough, MA (US); Maria Rzeznik, Marlborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 14/477,855

(22) Filed: Sep. 4, 2014

(65) Prior Publication Data

US 2017/0042039 A1    Feb. 9, 2017
US 2017/0156216 A9    Jun. 1, 2017

Related U.S. Application Data

(60) Provisional application No. 61/873,391, filed on Sep. 4, 2013.

(51) Int. Cl.

| | |
|---|---|
| *C23C 18/40* | (2006.01) |
| *H05K 3/18* | (2006.01) |
| *C23C 18/30* | (2006.01) |
| *C23C 18/34* | (2006.01) |
| *C23C 18/50* | (2006.01) |
| *C23C 18/16* | (2006.01) |
| *B01J 31/22* | (2006.01) |

(52) U.S. Cl.
CPC .......... *H05K 3/181* (2013.01); *B01J 31/2295* (2013.01); *C23C 18/166* (2013.01); *C23C 18/1641* (2013.01); *C23C 18/30* (2013.01); *C23C 18/34* (2013.01); *C23C 18/40* (2013.01); *C23C 18/50* (2013.01); *B01J 2231/005* (2013.01); *B01J 2531/824* (2013.01)

(58) Field of Classification Search
None
See application file for complete search history.

(56) References Cited

U.S. PATENT DOCUMENTS

| | | | |
|---|---|---|---|
| 4,248,632 A | 2/1981 | Ehrich et al. | |
| 4,517,254 A | 5/1985 | Grapentin et al. | |
| 2006/0096867 A1* | 5/2006 | Bokisa | C25D 3/56 205/253 |
| 2012/0145554 A1* | 6/2012 | Liu | C23C 18/161 205/187 |

FOREIGN PATENT DOCUMENTS

| | | |
|---|---|---|
| CA | 1234254 | 3/1988 |
| EP | 0139090 A1 | 5/1985 |
| EP | 0317092 A1 | 5/1989 |
| EP | 2465974 A2 | 5/2012 |

OTHER PUBLICATIONS

European Search Report for corresponding European Application No. 14 18 3349, dated Jan. 30, 2015.
Reference from corresponding Taiwan 103130539 application, dated Jan. 27, 2016.
Search Report for corresponding Chinese Application No. 201410667902.0, dated Oct. 17, 2016.

* cited by examiner

*Primary Examiner* — Shamim Ahmed
*Assistant Examiner* — Bradford M Gates
(74) *Attorney, Agent, or Firm* — John J. Piskorski

(57) ABSTRACT

Pyrazine derivatives which contain one or more electron donating groups on the ring are used as catalytic metal complexing agents in aqueous alkaline environments to catalyze electroless metal plating on metal clad and un-clad substrates. The catalysts are monomers and free of tin and antioxidants.

8 Claims, No Drawings

ELECTROLESS METALLIZATION OF DIELECTRICS WITH ALKALINE STABLE PYRAZINE DERIVATIVE CONTAINING CATALYSTS

FIELD OF THE INVENTION

The present invention is directed to electroless metallization of dielectrics with alkaline stable pyrazine derivative containing catalysts. More specifically, the present invention is directed to metallization of dielectrics with alkaline stable pyrazine derivative containing catalysts as a replacement for palladium/tin colloidal catalysts.

BACKGROUND OF THE INVENTION

Conventional printed circuit boards (PCBs) consist of laminated non-conductive dielectric substrates that rely on drilled and plated through holes (PTHs) to form a connection between the opposite sides and/or inner layers of a board. Electroless plating is a well-known process for preparing metallic coatings on surfaces. Electroless plating of a dielectric surface requires the prior deposition of a catalyst. The most commonly used method to catalyze or activate laminated non-conductive dielectric substrate regions, prior to electroless plating, is to treat the board with an aqueous tin-palladium colloid in an acidic chloride medium. The colloid consists of a metallic palladium core surrounded by a stabilizing layer of tin(II) ions. A shell of $[SnCl_3]^-$ complexes act as surface stabilizing groups to avoid agglomeration of colloids in suspension.

In the activation process, the palladium-based colloid is adsorbed onto an insulating substrate such as epoxy or polyimide to activate electroless copper deposition. Theoretically, for electroless metal deposition, the catalyst particles play roles as carriers in the path of transfer of electrons from reducing agent to metal ions in the plating bath. Although the performance of an electroless copper process is influenced by many factors such as composition of the deposition solution and choice of ligand, the activation step is the key factor for controlling the rate and mechanism of electroless deposition. Palladium/tin colloid has been commercially used as an activator for electroless metal deposition for decades, and its structure has been extensively studied. Yet, its sensitivity to air and high cost leave room for improvement or substitution.

While the colloidal palladium catalyst has given good service, it has many shortcomings which are becoming more and more pronounced as the quality of manufactured printed circuit boards increases. In recent years, along with the reduction in sizes and an increase in performance of electronic devices, the packaging density of electronic circuits has become higher and subsequently required to be defect free after electroless plating. As a result of greater demands on reliability alternative catalyst compositions are required. The stability of the colloidal palladium catalyst is also a concern. As mentioned above, the palladium/tin colloid is stabilized by a layer of tin(II) ions and its counter-ions can prevent palladium from aggregating. The tin(II) ions easily oxidize to tin(IV) and thus the colloid cannot maintain its colloidal structure. This oxidation is promoted by increases in temperature and agitation. If the tin(II) concentration is allowed to fall close to zero, then palladium particles can grow in size, agglomerate, and precipitate.

Considerable efforts have been made to find new and better catalysts. For example, because of the high cost of palladium, much of the effort has been directed toward the development of a non-palladium or bimetallic alternative catalysts. In the past, problems have included the fact that they are not sufficiently active or reliable enough for through-hole plating. Furthermore, these catalysts typically become progressively less active upon standing, and this change in activity renders such catalysts unreliable and impractical for commercial use. U.S. Pat. No. 4,248,632 discloses a non-palladium/tin catalyst for electroless plating. The catalyst includes a complex of a catalytic metal, such as palladium or alternative metals such as silver and gold, nitrogen containing ligands and acid radicals; however, an acid environment is critical for its activating performance. Acid environments typically cause undesired corrosion of metal cladding found on many dielectric substrates resulting in defective articles. This problem is very common in the manufacture of printed circuit boards where the boards are often heavily clad with copper, thus acid environments are highly undesirable in the industry.

Preferably metal clad dielectrics are electrolessly plated in alkaline environments but many non-palladium/tin catalysts are unstable and unreliable under such conditions. U.S. Pat. No. 5,503,877 discloses another non-palladium/tin catalyst which may be used in an acid as well as an alkaline environment. The catalyst is composed of a catalytic metal such as palladium, silver or gold, nitrogen containing ligands and solvent component; however, the catalyst must first be heated for prolonged periods of time to form an oligomer/polymer otherwise it is insufficiently active. Further, prolonged heating and subsequent cooling for packaging causes more cost due to increased manpower and facility charges in large scale catalyst preparation. Accordingly, there is still a need for a replacement catalyst for palladium/tin.

SUMMARY OF THE INVENTION

Methods include providing a substrate including a dielectric; applying an aqueous alkaline catalyst solution to the substrate including the dielectric, the aqueous alkaline catalyst includes a complex of metal ions and one or more pyrazine derivatives having formula:

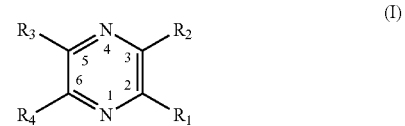

(I)

where $R_1$, $R_2$, $R_3$ and $R_4$ may be the same or different and are hydrogen, linear or branched $(C_1\text{-}C_5)$alky, $-N(R)_2$ linear or branched amino$(C_1\text{-}C_5)$alkyl, acetyl, linear or branched hydroxy$(C_1\text{-}C_5)$alkyl, or linear or branched $(C_1\text{-}C_5)$alkoxy, and where R may be the same or different and is hydrogen or linear or branched $(C_1\text{-}C_5)$alkyl, and with the proviso that at least one of $R_1$, $R_2$, $R_3$ and $R_4$ is other than hydrogen; applying a reducing agent to the substrate including the dielectric; and immersing the substrate including the dielectric into an alkaline metal plating bath to electrolessly plate metal on the substrate with the dielectric.

The aqueous alkaline catalysts may be used to electrolessly plate metals on substrates of dielectric materials and substrates which also include metal cladding. The aqueous alkaline catalysts are storage stable and are stable during electroless metal plating even in alkaline electroless metal plating environments. They do not readily oxidize as compared to conventional tin/palladium catalysts even though the aqueous alkaline catalysts are free of antioxidants. They do not require strong acids to prepare or maintain stability, thus they are less corrosive than conventional catalysts. They do not require tin compounds for stability and may be halogen free as halogens may be corrosive. Also, prolonged heating is not required to form stable and catalytically active metal ligand complexes, thus providing a more efficient electroless plating method. The catalysts enable good metal coverage during via and through-hole filling in the manufacture of printed circuit boards.

DETAILED DESCRIPTION OF THE INVENTION

As used throughout this specification, the abbreviations given below have the following meanings, unless the context clearly indicates otherwise: g=gram; mg=milligram; mL=milliliter; L=liter; cm=centimeter; m=meter; mm=millimeter; μm=micron; ppm=parts per million; M=molar; ° C.=degrees Centigrade; g/L=grams per liter; DI=deionized; Pd=palladium; wt %=percent by weight; and $T_g$=glass transition temperature.

The term "electron donating group" means an atom or functional group that donates some of its electron density into a conjugated π system via resonance or inductive electron withdrawal, thus making the π system more nucleophilic. The term "monomer" or "monomeric" means a single molecule which may combine with one or more of the same or similar molecules. The term "oligomer" means two or three monomers combined to form a single molecule. The term "polymer" means two or more monomers combined or two or more oligomers combined to form a single molecule. The terms "printed circuit board" and "printed wiring board" are used interchangeably throughout this specification. The terms "plating" and "deposition" are used interchangeably throughout this specification. All amounts are percent by weight, unless otherwise noted. All numerical ranges are inclusive and combinable in any order except where it is logical that such numerical ranges are constrained to add up to 100%.

Aqueous akaline catalyst solutions include complexes of metal ions chosen from silver, gold, platinum, palladium, copper, cobalt and nickel, and one or more pyrazine derivative complexing compounds having formula:

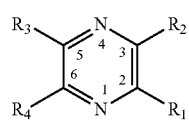

(I)

where $R_1$, $R_2$, $R_3$ and $R_4$ may be the same or different and are hydrogen, linear or branched ($C_1$-$C_5$)alky; —N(R)$_2$, linear or branched amino($C_1$-$C_5$)alkyl, acetyl, linear or branched hydroxy($C_1$-$C_5$)alkyl, or linear or branched ($C_1$-$C_5$)alkoxy, and where R may be the same or different and is hydrogen or linear or branched ($C_1$-$C_5$)alkyl, and with the proviso that at least one of $R_1$, $R_2$, $R_3$ and $R_4$ is other than hydrogen. Other than hydrogen $R_1$, $R_2$, $R_3$ and $R_4$ are electron donating groups. Preferably, $R_1$, $R_2$, $R_3$ and $R_4$ may be the same or different and are hydrogen, ($C_1$-$C_2$)alkyl, —NH$_2$, acetyl, ($C_1$-$C_2$)alkoxy or hydroxy($C_1$-$C_3$)alkyl with the proviso that at least one of $R_1$, $R_2$, $R_3$ and $R_4$ is an electron donating group. More preferably $R_1$, $R_2$, $R_3$ and $R_4$ are the same or different and are hydrogen or methyl with the proviso that at least two of $R_1$, $R_2$, $R_3$ and $R_4$ are methyl. Most preferably two of $R_1$, $R_2$, $R_3$ and $R_4$ are methyl with the remainder hydrogen.

Examples of such pyrazine derivatives are 2,6-dimethylpyrazine, 2,3-dimethylpyrazine, 2,5-dimethylpyrazine, 2,3,5-trimethylpyraizine, 2-acetylpyrazine, aminopyrazine, ethylpyrazine, methoxypyrazine, and 2-(2'-hydroxyethyl)pyrazine.

Sources of metal ions include any of the conventional water soluble metal salts known in the art and literature which provide metals having catalytic activity. One type of catalytic metal ion may be used or mixtures of two or more catalytic metal ions may be used. Such salts are included to provide metal ions in amounts of 20 ppm to 2000 ppm, preferably from 25 ppm to 500 ppm. Silver salts include, but are not limited to silver nitrate, silver acetate, silver trifluoroacetate, silver tosylate, silver triflate, silver fluoride, silver oxide, silver sodium thiosulfate and silver potassium cyanide. Palladium salts include, but are not limited to palladium chloride, palladium acetate, palladium potassium chloride, palladium sodium chloride, sodium tetrachloropalladate, palladium sulfate and palladium nitrate. Gold salts include, but are not limited to gold cyanide, gold trichloride, gold tribromide, potassium gold chloride, potassium gold cyanide, sodium gold chloride and sodium gold cyanide. Platinum salts include, but are not limited to platinum chloride and platinum sulfate. Copper salts include, but are not limited to copper sulfate and copper chloride. Nickel salts include, but are not limited to nickel chloride and nickel sulfate. Cobalt salts include, but are not limited to cobalt acetate, cobalt chloride, cobalt bromide and cobalt ammonium sulfate. Preferably the metal ions are silver, palladium and gold ions. More preferably the metal ions are silver and palladium. Most preferably the ions are palladium.

The components which make up the aqueous alkaline catalysts may be combined in any order. Any suitable method known in the art and literature may be used to prepare the aqueous catalysts; however, no heating is required to form an active form of the catalyst of the complexing pyrazine derivative and the metal ions. The amount of pyrazine derivative complexing compounds and one or more metal ions included in the aqueous alkaline catalyst solutions are such that a molar ratio of complexing compounds to metal ions is from 1:1 to 4:1, preferably from 1:1 to 2:1. In general, one or more of the complexing compounds is first solubilized in a sufficient amount of water. One or more sources of metal ions are dissolved in a minimal amount of water and then combined with the complexing solution with stirring to form a uniform aqueous solution. Typically the catalyst solution is prepared at room temperature but some heating may be required to expedite solubilization of the components. The pH of the aqueous catalyst solution is adjusted to an alkaline pH with salts such as sodium tetraborate, sodium carbonate, sodium bicarbonate, sodium phosphate or alkali metal hydroxides such as potassium or sodium hydroxide or mixtures thereof. The pH range of the aqueous alkaline catalyst solution is from 8.5 and greater, preferably from 9 and greater, more preferably from 9 to 13, most preferably from 9 to 12. The aqueous alkaline catalysts are free of tin, tin ions and antioxidants. Preferably the aqueous alkaline catalysts are halogen free.

Following application of the catalyst to the substrate and prior to metallization one or more reducing agents are applied to the catalyzed substrate to reduce the metal ions to their metallic state. Conventional reducing agents known to reduce metal ions to metal may be used. Such reducing agents include, but are not limited to dimethylamine borane, sodium borohydride, ascorbic acid, iso-ascorbic acid, sodium hypophosphite, hydrazine hydrate, formic acid and formaldehyde. Preferably the reducing agent is sodium hypophosphite. Reducing agents are included in amounts to reduce substantially all of the metal ions to metal. Such amounts are generally conventional amounts and are well known by those of skill in the art.

The aqueous alkaline catalysts may be used to electrolessly metal plate various substrates such as semiconductors, metal-clad and unclad substrates such as printed circuit boards. Such metal-clad and unclad printed circuit boards may include thermosetting resins, thermoplastic resins and combinations thereof, including fiber, such as fiberglass, and impregnated embodiments of the foregoing. Preferably the substrate is a metal-clad printed circuit or wiring board.

Thermoplastic resins include, but are not limited to acetal resins, acrylics, such as methyl acrylate, cellulosic resins, such as ethyl acetate, cellulose propionate, cellulose acetate butyrate and cellulose nitrate, polyethers, nylon, polyethylene, polystyrene, styrene blends, such as acrylonitrile styrene and copolymers and acrylonitrile-butadiene styrene copolymers, polycarbonates, polychlorotrifluoroethylene, and vinylpolymers and copolymers, such as vinyl acetate, vinyl alcohol, vinyl butyral, vinyl chloride, vinyl chloride-acetate copolymer, vinylidene chloride and vinyl formal.

Thermosetting resins include, but are not limited to allyl phthalate, furane, melamine-formaldehyde, phenol-formaldehyde and phenol-furfural copolymers, alone or compounded with butadiene acrylonitrile copolymers or acrylonitrile-butadiene-styrene copolymers, polyacrylic esters, silicones, urea formaldehydes, epoxy resins, allyl resins, glyceryl phthalates and polyesters.

The catalysts may be used to plate substrates with both low and high $T_g$ resins. Low $T_g$ resins have a $T_g$ below 160° C. and high $T_g$ resins have a $T_g$ of 160° C. and above. Typically high $T_g$ resins have a $T_g$ of 160° C. to 280° C. or such as from 170° C. to 240° C. High $T_g$ polymer resins include, but are not limited to, polytetrafluoroethylene (PTFE) and polytetrafluoroethylene blends. Such blends include, for example, PTFE with polypheneylene oxides and cyanate esters. Other classes of polymer resins which include resins with a high Tg include, but are not limited to, epoxy resins, such as difunctional and multifunctional epoxy resins, bimaleimide/triazine and epoxy resins (BT epoxy), epoxy/polyphenylene oxide resins, acrylonitrile butadienestyrene, polycarbonates (PC), polyphenylene oxides (PPO), polypheneylene ethers (PPE), polyphenylene sulfides (PPS), polysulfones (PS), polyamides, polyesters such as polyethyleneterephthalate (PET) and polybutyleneterephthalate (PBT), polyetherketones (PEEK), liquid crystal polymers, polyurethanes, polyetherimides, epoxies and composites thereof.

The catalysts may be used to deposit metals on dielectric materials and the walls of through-holes or vias of printed circuit boards. The catalysts may be used in both horizontal and vertical processes of manufacturing printed circuit boards.

The aqueous catalysts may be used with conventional aqueous alkaline electroless metal plating baths. While it is envisioned that the catalysts may be used to electrolessly deposit any metal which may be electrolessly plated, preferably, the metal is chosen from copper, copper alloys, nickel or nickel alloys. More preferably the metal is chosen from copper and copper alloys, most preferably copper is the metal. An example of a commercially available electroless copper plating bath is CIRCUPOSIT™ 880 Electroless Copper bath (available from Dow Advanced Materials, Marlborough, Mass.).

Typically sources of copper ions include, but are not limited to water soluble halides, nitrates, acetates, sulfates and other organic and inorganic salts of copper. Mixtures of one or more of such copper salts may be used to provide copper ions. Examples include copper sulfate, such as copper sulfate pentahydrate, copper chloride, copper nitrate, copper hydroxide and copper sulfamate. Conventional amounts of copper salts may be used in the compositions. In general copper ion concentrations in the composition may range from 0.5 g/L to 30 g/L.

One or more alloying metals also may be included in the electroless compositions. Such alloying metals include, but are not limited to nickel and tin. Examples of copper alloys include copper/nickel and copper/tin. Typically the copper alloy is copper/nickel.

Sources of nickel ions for nickel and nickel alloy electroless baths may include one or more conventional water soluble salts of nickel. Sources of nickel ions include, but are not limited to, nickel sulfates and nickel halides. Sources of nickel ions may be included in the electroless alloying compositions in conventional amounts. Typically sources of nickel ions are included in amounts of 0.5 g/L to 10 g/L.

Conventional steps used for electrolessly metal plating a substrate may be used with the catalysts; however, the aqueous alkaline catalysts do not require an acceleration step where tin is stripped to expose the palladium metal for electroless plating as in many conventional processes. Accordingly, acceleration steps are excluded when using the catalysts. Preferably, the catalysts are applied to the surface of the substrate to be electrolessly plated with a metal followed by application of a reducing agent to the catalyzed substrate and then application of the metal plating bath. Electroless metal plating parameters, such as temperature and time may be conventional. The pH of the electroless metal plating bath is alkaline. Conventional substrate preparation methods, such as cleaning or degreasing the substrate surface, roughening or micro-roughening the surface, etching or micro-etching the surface, solvent swell applications, desmearing through-holes and various rinse and anti-tarnish treatments may be used. Such methods and formulations are well known in the art and disclosed in the literature.

Preferably, the substrate to be metal plated is a metal-clad substrate with dielectric material and a plurality of through-holes such as a printed circuit board. The boards are rinsed with water and cleaned and degreased followed by desmearing the through-hole walls. Typically prepping or softening the dielectric or desmearing of the through-holes begins with application of a solvent swell.

Any conventional solvent swell may be used. The specific type may vary depending on the type of dielectric material. Examples of dielectrics are disclosed above. Minor experimentation may be done to determine which solvent swell is suitable for a particular dielectric material. The $T_g$ of the dielectric often determines the type of solvent swell to be used. Solvent swells include, but are not limited to glycol ethers and their associated ether acetates. Conventional amounts of glycol ethers and their associated ether acetates may be used. Examples of commercially available solvent swells are CIRCUPOSIT™ Conditioner 3302, CIRCUPOSIT™ Hole Prep 3303 and CIRCUPOSIT™ Hole Prep 4120 solutions (available from Dow Advanced Materials).

After the solvent swell, a promoter may be applied. Conventional promoters may be used. Such promoters include sulfuric acid, chromic acid, alkaline permanganate or plasma etching. Typically alkaline permanganate is used as the promoter. Examples of commercially available promoters are CIRCUPOSIT™ Promoter 4130 and CIRCUPOSIT™ MLB Promoter 3308 solutions (available from Dow Advanced Materials). Optionally, the substrate and through-holes are rinsed with water.

A neutralizer is then applied to neutralize any residues left by the promoter. Conventional neutralizers may be used. Typically the neutralizer is an aqueous acidic solution containing one or more amines or a solution of 3 wt % hydrogen peroxide and 3 wt % sulfuric acid. An example of a commercially available neutralizer is CIRCUPOSIT™ MLB Neutralizer 216-5. Optionally, the substrate and through-holes are rinsed with water and then dried.

After neutralizing an acid or alkaline conditioner is applied when plating through-holes. Conventional conditioners may be used. Such conditioners may include one or more cationic surfactants, non-ionic surfactants, complexing agents and pH adjusters or buffers. Examples of commercially available acid conditioners are CIRCUPOSIT™ Conditioners 3320 and 3327 solutions (available from Dow Advanced Materials). Suitable alkaline conditioners include, but are not limited to aqueous alkaline surfactant solutions containing one or more quaternary amines and polyamines Examples of commercially available alkaline surfactants are CIRCUPOSIT™ Conditioner 231, 3325, 813 and 860 formulations. Optionally, the substrate and through-holes are rinsed with water.

Conditioning may be followed by micro-etching. Conventional micro-etching compositions may be used. Micro-etching is designed to provide a micro-roughened metal surface on exposed metal (e.g. innerlayers and surface etch) to enhance subsequent adhesion of plated electroless metal and later electroplate. Micro-etches include, but are not limited to 60 g/L to 120 g/L sodium persulfate or sodium or potassium oxymonopersulfate and sulfuric acid (2%) mixture, or generic sulfuric acid/hydrogen peroxide. Examples of commercially available micro-etching compositions are CIRCUPOSIT™ Microetch 3330 Etch solution and PREPOSIT™ 748 Etch solution both available from Dow Advanced Materials. Optionally, the substrate is rinsed with water.

Optionally, a pre-dip may then applied to the micro-etched substrate and through-holes. Examples of pre-dips include organic salts such as sodium potassium tartrate, sodium carbonate or sodium citrate, 0.5% to 3% sulfuric acid or an acidic solution of 25 g/L to 75 g/L sodium sulfate.

The aqueous alkaline catalyst is then applied to the substrate. Application may be done by conventional methods used in the art, such as immersing the substrate in a solution of the catalyst or by spraying using conventional apparatus. Catalyst dwell time may range from 1 minute to 10 minutes, typically from 2 minutes to 8 minutes for vertical equipment and for 25 seconds to 120 seconds for horizontal equipment. The catalysts may be applied at temperatures from room temperature to 80° C., typically from 30° C. to 60° C. The substrate and through-holes optionally may be rinsed with water after application of the catalyst.

The reducing solution is then applied to the substrate to reduce the metal ions of the catalyst to their metallic state. The reducing solution may be applied by immersing the substrate into the reducing solution or spraying the reducing solution onto the substrate. The temperature of the solution may range from room temperature to 65° C., typically from 30° C. to 55° C. Contact time between the reducing solution and the catalyzed substrate may range from 30 seconds to 5 minutes before application of the electroless metal plating bath.

The substrate and walls of the through-holes are then electrolessly plated with metal, such as copper, copper alloy, nickel or nickel alloy using an electroless bath. Preferably copper is plated on the walls of the through-holes. Plating times and temperatures may be conventional. Typically metal deposition is done at temperatures of 20° C. to 80°, more typically from 30° C. to 60° C. The substrate may be immersed in the electroless plating bath or the electroless bath may be sprayed onto the substrate. Typically, electroless plating may be done for 5 seconds to 30 minutes; however, plating times may vary depending on the thickness of the metal desired. Plating is done in an alkaline environment to prevent undesired corrosion of any metal cladding on the substrate. Typically the pH of the plating solution is 8 and higher, preferably the pH is 8.5 and greater, more preferably the pH is from 9 to 13, most preferably the pH is from 9 to 12.

Optionally anti-tarnish may be applied to the metal. Conventional anti-tarnish compositions may be used. An example of anti-tarnish is ANTI TARNISH™ 7130 solution (available from Dow Advanced Materials). The substrate may optionally be rinsed with water and then the boards may be dried.

Further processing may include conventional processing by photoimaging and further metal deposition on the substrates such as electrolytic metal deposition of, for example, copper, copper alloys, tin and tin alloys.

The aqueous alkaline catalysts may be used to electrolessly plate metals on substrates of dielectric materials and substrates which also include metal cladding. The aqueous alkaline catalysts are storage stable and are stable during electroless metal plating even in alkaline electroless metal plating environments. They do not readily oxidize as compared to conventional tin/palladium catalysts even though the aqueous alkaline catalysts are free of antioxidants. They do not require strong acids to prepare or maintain stability, thus they are less corrosive than conventional catalysts. They do not require tin compounds for stability and may be halogen free as halogens may be corrosive. Also, prolonged heating is not required to form stable and catalytically active metal ligand complexes providing a more efficient electroless plating method. The catalysts enable good metal coverage during via and through-hole filling in the manufacture of printed circuit boards.

The following examples are not intended to limit the scope of the invention but to further illustrate the invention.

EXAMPLE 1

A catalyst containing 1,000 ppm palladium ions and 1,020 ppm 2,6-dimethylpyrazine in one liter of water was prepared with the following procedure: 1.02 g 2,6-dimethylpyrazine was dissolved in 500 mL of DI water. 2.6 g of palladium nitrate hydrate was dissolved in 500 mL of DI water and filtered using a 1 μm membrane. The 2,6-dimethylpyrazine solution was slowly added to the palladium solution with stir bar agitation. The mixture was stirred 60 minutes at room temperature. A second and third catalyst was prepared containing 1,000 ppm palladium ions and 1020 ppm 2,5-dimethylpyrazine or 1150 ppm 2,3,5-trimethylpyrazine in one liter of water using the above same procedure. The molar ratio of complexing agent to metal ions in each of the catalysts was 1:1.

An aliquot of each catalyst concentrate was then diluted with DI water to make a one liter 75-100 ppm palladium catalyst working bath. 2 g of sodium tetraborate was added to the catalyst bath as a buffer. The pH of each catalyst bath was further adjusted to 9-9.5 using 1 M NaOH or 5% nitric acid. The catalyst baths were then used to electrolessly plate NY-1140 un-clad laminates from NanYa according to the method as follows:

1. Each un-clad laminate was immersed in either an alkaline CIRCUPOSIT™ Conditioner 3325 solution at 50° C. or acidic CIRCUPOSIT™ 3320A solution at 46° C. for 5 minutes, then rinsed with flowing tap water for 4 minutes;
2. The laminates were immersed in sulfuric acid and sodium persulfate based PREPOSIT™ 748 Etch solution at room temperature for 1 minute and then rinsed with flowing DI water rinse for 4 minutes;
3. Each laminate was immersed into one of the three aqueous alkaline catalyst solutions for 5 minutes at 40° C. followed by rinsing for 1 minute with flowing DI water;
4. The laminates were then immersed into a 0.25M sodium hypophosphite solution at 50° C. for 1 minute to reduce the palladium ions to palladium metal and then rinsed with flowing DI water for 1 minute;
5. The activated laminates were immersed in CIRCUPOSIT™ 880 Electroless Copper bath at 40° C. for 15 minutes to plate copper on the laminates;
6. After copper plating the laminates were rinsed with flowing tap water for 4 minutes.

Each laminate was examined for copper plating performance. All the laminate surface areas were completely covered by a layer of copper and the cooper deposit appeared shinny and uniform. They all passed the Scotch tape test suggesting good adhesion to the laminate. Thus all the catalysts were active without the need for heating during preparation.

EXAMPLE 2

The catalyst solution of 2,6-dimethylpyrazine prepared in Example 1 was used to plate copper-clad laminates with through-holes and were compared to a conventional colloidal palladium/tin catalyst. Two sets of six different copper-clad panels with a plurality of through-holes were provided: TUC-662, SY-1141, SY-1000-2, IT-158, IT-180 and NPG-150. TUC-662 was obtained from Taiwan Union Technology, SY-1141 and SY-1000-2 were obtained from Shengyi. The IT-158 and IT-180 are from ITEQ Corp. and the NPG-150 is from NanYa. The $T_g$ values of the panels ranged from 140° C. to 180° C. Each panel was 5 cm×12 cm and was treated as follows:

1. Each set of panels was immersed in the CIRCUPOSIT™ MLB Conditioner 211 solution for 7 minutes at 80° C.;
2. The through-holes of each panel were then rinsed with flowing tap water for 4 minutes;
3. The through-holes were then treated with CIRCUPOSIT™ MLB Promoter 3308 aqueous permanganate solution at 80° C. for 10 minutes;
4. The through-holes were then rinsed for 4 minutes in flowing tap water;
5. The through-holes were then treated with a 3 wt % sulfuric acid/3 wt % hydrogen peroxide neutralizer at room temperature for 2 minutes;
6. The through-holes of each panel were then rinsed with flowing tap water for 4 minutes;
7. The through-holes of each panel were then treated with CIRCUPOSIT™ Conditioner 3325 alkaline solution for 5 minutes at 50° C.;
8. The through-holes were then rinsed with flowing tap water for 4 minutes;
9. The through-holes were then treated with 1% sulfuric acid and sodium persulfate etch for 2 minutes at room temperature. The through-holes of each panel were then rinsed with flowing DI water for 4 minutes;
10. One set of the panels was then immersed in CATAPREP™ 404 Pre-Dip solution at room temperature for 1 minute, followed by immersing the panels in CATAPOSIT™ 44 palladium/tin catalyst with 75 ppm palladium metal for 5 minutes at 40° C.; while the other set of panels was immersed in the aqueous alkaline catalyst containing 75 ppm of palladium ions and 75 ppm 2,6-dimethylpyrazine for 5 minutes at 40° C.;
11. The panels which were treated with the aqueous alkaline catalyst containing palladium ions and 2,6-dimethylpyrazine were then immersed in a 0.25 M solution of sodium hypophosphite reducing agent at 50° C. for 1 minute;
12. All of the panels were then rinsed with flowing DI water for 2 minutes;
13. The panels were then immersed in CIRCUPOSIT™ 880 Electroless Copper plating bath at 40° C. for 15 minutes to deposit copper on the walls of the through-holes;
14. The copper plated laminates were then rinsed with cold water for 4 minutes;
15. Each copper plated laminate was then dried with compressed air; and
16. The walls of the through-holes of the laminates were examined for copper plating coverage using the backlight process described below.

Each board was cross-sectioned nearest to the centers of the through-holes as possible to expose the copper plated walls. The cross-sections, no more than 3 mm thick from the center of the through-holes, were taken from each board to determine the through-hole wall coverage. The European Backlight Grading Scale was used. The cross-sections from each board were placed under a conventional optical microscope of 50× magnification with a light source behind the samples. The quality of the copper deposits was determined by the amount of light visible under the microscope that was transmitted through the sample. Transmitted light is only be visible in areas of the plated through holes where there is incomplete electroless copper coverage. If no light was transmitted and the section appeared completely black, it was rated a 5 on the backlight scale indicating complete copper coverage of the through-hole wall. If light passed through the entire section without any dark areas, this indicated that there was very little to no copper metal deposition on the wall and the section was rated 0. If sections had some dark regions as well as light regions, they were rated between 0 and 5. A minimum of ten through-holes was inspected and rated for each board.

The palladium/2,6-dimethylpyrazine catalyst performed substantially the same as the conventional palladium/tin colloidal catalyst with backlight values of 4.7-4.9. Typically backlight values of 4.5 and greater are indicative of commercially acceptable catalysts in the plating

EXAMPLE 3

A pyrazine derivative with an electron-withdrawing functional group was used to prepare an ionic catalyst containing 1,000 ppm palladium ions and 1,080 ppm 2-chloropyrazine in one liter of water. 1.08 g 2-chloropyrazine was dissolved in 500 mL of DI water. 2.6 g of palladium nitrate hydrate was dissolved in 500 mL of DI water and filtered using a 1 μm membrane. The 2-chloropyrazine solution was slowly added to the palladium ion solution with stir bar agitation at room temperature. A yellow precipitate was observed a few minutes later after the mixing indicating instability of the preparation.

EXAMPLE 4

An ionic catalyst containing 1,000 ppm silver ions and 1,110 ppm 2-(2'-hydroxyethyl)pyrazine in one liter of water is prepared with the following procedure: dissolve 1.11 g 2-(2'-hydroxyethyl) pyrazine with 500 mL of DI water. 1.57 g of silver nitrate is dissolved in 500 mL of DI water. The 2-(2'-hydroxyethyl)pyrazine solution was slowly added to the silver solution with stir bar agitation. The mixture is stirred 60 minutes at room temperature. The molar ratio of complexing agent to silver ions is 1:1.

An aliquot of the ionic catalyst concentrate is then taken out and diluted with DI water to make a one liter 250 ppm silver catalyst working bath. Sodium carbonate is added to the catalyst bath to adjust pH to 9-9.5. The catalyst bath is then used to electrolessly plate NY-1140 un-clad laminates from NanYa according to the method described in Example 1. The laminates are expected to have a shinny and uniform copper deposit, and pass the Scotch tape test suggesting good adhesion between the electroless copper and the laminate.

What is claimed is:
1. A method comprising:
 a) providing a substrate comprising a dielectric, wherein the dielectric is chosen from one or more of fiberglass, epoxy resin, acrylonitrile butadienestyrene, polyphenylene ethers, polyphenylene sulfides, polysulfones and polytetrafluoroethylene;
 b) applying an aqueous alkaline catalyst solution to the substrate comprising the dielectric, the aqueous alkaline catalyst comprises a monomeric complex of palladium ions and one or more pyrazine derivatives having formula:

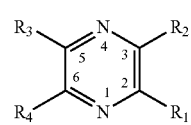

wherein $R_1$, $R_2$, $R_3$ and $R_4$ may be the same or different and are hydrogen, linear or branched $(C_1-C_5)$alky, $-N(R)_2$, linear or branched amino$(C_1-C_5)$alkyl, acetyl, linear or branched hydroxy$(C_1-C_5)$alkyl, or linear or branched $(C_1-C_5)$alkoxy, and where R may be the same or different and is linear or branched $(C_1-C_5)$alkyl, and with the proviso that at least one of $R_1$, $R_2$, $R_3$ and $R_4$ is other than hydrogen, wherein the aqueous alkaline catalyst is free of tin;
 c) applying a reducing agent to the substrate comprising the dielectric and the aqueous alkaline catalyst comprising the monomeric complex and the palladium ions to reduce the palladium ions to their metallic state prior to metallization of the substrate; and
 d) immersing the substrate comprising the dielectric and palladium metal into an alkaline metal plating bath to electrolessly plate metal on the substrate comprising the dielectric.
2. The method of claim 1, wherein the one or more pyrazine derivatives are chosen from 2,6-dimethylpyrazine, 2,3-dimethylpyrazine, 2,5-dimethylpyrazine, 2,3,5-trimethylpyraizine, 2-acetylpyrazine, ethylpyrazine, methoxypyrazine, 3,4-dimethylpyrazine and 2-(2'-hydroxyethyl)pyrazine.
3. The method of claim 1, wherein a molar ratio of the one or more pyrazine derivatives to the metal ions is 1:1 to 4:1.
4. The method of claim 1, wherein the electrolessly plated metal on the substrate is copper, copper alloy, nickel or nickel alloy.
5. The method of claim 1, wherein the aqueous alkaline catalyst solution has a pH of 8.5 or greater.
6. The method of claim 5, wherein the aqueous alkaline catalyst solution has pH of 9 or greater.
7. The method of claim 1, wherein the substrate comprising the dielectric further comprises a plurality of through-holes.
8. The method of claim 7, wherein the substrate comprising the dielectric further comprises metal cladding.

* * * * *